United States Patent
Hoover et al.

(10) Patent No.: US 6,388,882 B1
(45) Date of Patent: May 14, 2002

(54) INTEGRATED THERMAL ARCHITECTURE FOR THERMAL MANAGEMENT OF HIGH POWER ELECTRONICS

(75) Inventors: L. Ronald Hoover; Jon Zuo, both of Lancaster; A. L. Phillips, Pine Grove, all of PA (US)

(73) Assignee: Thermal Corp., Georgetown, DE (US)

(*) Notice: Subject to any disclaimer, the term of this patent is extended or adjusted under 35 U.S.C. 154(b) by 0 days.

(21) Appl. No.: 09/909,360

(22) Filed: Jul. 19, 2001

(51) Int. Cl.[7] .................................. H05K 7/20
(52) U.S. Cl. .................. 361/704; 361/688; 361/689; 361/699; 361/700; 174/15.1; 174/15.2; 165/80.4; 165/104.33; 165/185; 454/184
(58) Field of Search ................. 361/688–704, 361/715, 716, 718–721; 257/712, 714, 715; 174/15.1, 15.2, 16.1; 165/80.3–80.5, 104.33, 185; 457/184

(56) References Cited

U.S. PATENT DOCUMENTS

| | | | |
|---|---|---|---|
| 2,522,365 A | 9/1950 | Greene | 219/39 |
| 2,720,763 A | 10/1955 | Doebeli | 62/126 |
| 2,742,268 A | 4/1956 | Tarr | 257/14 |
| 3,275,921 A | 9/1966 | Fellendorf et al. | 321/8 |
| 3,317,798 A | 5/1967 | Chu et al. | 317/100 |
| 3,387,648 A | 6/1968 | Ward et al. | 165/104.33 |
| 3,563,307 A | 2/1971 | Paine et al. | 165/86 |
| 3,613,778 A | 10/1971 | Feldman, Jr. | 165/105 |
| 3,643,131 A | 2/1972 | Scherbaum | 317/100 |
| 3,651,865 A | 3/1972 | Feldmanis | 165/80 |
| 3,749,156 A | 7/1973 | Fletcher et al. | 165/32 |
| 3,754,594 A | 8/1973 | Ferrell | 165/32 |
| 3,812,402 A * | 5/1974 | Garth | 361/687 |
| 3,903,699 A | 9/1975 | Davis | 60/641 |
| 4,046,190 A | 9/1977 | Marcus et al. | 165/105 |
| 4,047,198 A | 9/1977 | Sekhon et al. | 357/82 |

(List continued on next page.)

FOREIGN PATENT DOCUMENTS

| | | |
|---|---|---|
| CH | 677293 | 4/1991 |
| EP | 0157370 | 10/1985 |
| GB | 758524 | 10/1956 |
| GB | 826625 | 1/1960 |
| GB | 2079655 | 1/1982 |
| JP | 56-137035 | 10/1981 |
| JP | 61-51861 | 3/1986 |
| JP | 63-221655 | 9/1988 |
| JP | 63-262861 | 10/1988 |
| JP | 1-286349 | 11/1989 |
| JP | 2240951 | 9/1990 |
| JP | 3-142026 | 6/1991 |
| JP | 9069595 | 3/1997 |
| SU | 788461 | 12/1980 |

OTHER PUBLICATIONS

Chrysler et al., "Enhanced Thermosyphon Cooling System," IBM Technical Disclosure bulletin, vol. 37, No. 10, Oct. 1994, pp. 11–12.

Primary Examiner—Leo P. Picard
Assistant Examiner—Boris Leo Chervinsky
(74) Attorney, Agent, or Firm—Duane Morris LLP

(57) ABSTRACT

The present invention provides a thermal energy management architecture for a functioning system of electronic components and subsystems comprising a hierarchical scheme in which thermal management components are: (i) operatively engaged with individual portions of the system of electronic components and subsystems, in multiple defined levels and (ii) substantially only thermally driven, i.e., heat transfer devices that have no moving parts and require no external power for their operations. In one embodiment thermal management devices and technologies are divided into five separate levels within a functioning electronics system. In another embodiment, a sixth level is provided for bypassing one or more of the five levels.

28 Claims, 6 Drawing Sheets

U.S. PATENT DOCUMENTS

| | | | |
|---|---|---|---|
| 4,118,756 A | 10/1978 | Nelson et al. | 361/385 |
| 4,138,692 A | 2/1979 | Meeker et al. | 357/76 |
| 4,145,708 A | 3/1979 | Ferro et al. | 357/82 |
| 4,185,369 A | 1/1980 | Darrow et al. | 29/156.8 |
| 4,187,711 A | 2/1980 | Lavochkin et al. | 72/256 |
| 4,222,436 A | 9/1980 | Pravda | 165/105 |
| 4,231,423 A | 11/1980 | Haslett | 165/105 |
| 4,259,268 A | 3/1981 | DiRoss | 261/151 |
| 4,323,914 A | 4/1982 | Berndlmaier et al. | 357/82 |
| 4,333,517 A | 6/1982 | Parro | 165/1 |
| 4,366,526 A | 12/1982 | Lijoi et al. | 361/385 |
| 4,378,626 A | 4/1983 | Eitel | 29/527.2 |
| 4,452,051 A | 6/1984 | Berger et al. | 62/467 |
| 4,503,483 A | 3/1985 | Basiulis | 361/385 |
| 4,508,163 A | 4/1985 | McCarthy | 165/80 |
| 4,509,839 A | 4/1985 | Lavochkin | 357/81 |
| 4,544,942 A | 10/1985 | McCarthy | 357/81 |
| 4,602,679 A | 7/1986 | Edelstein et al. | 165/104.26 |
| 4,607,498 A | 8/1986 | Dinh | 62/185 |
| 4,697,205 A | 9/1987 | Eastman | 357/82 |
| 4,724,901 A | 2/1988 | Munekawa | 165/104.21 |
| 4,727,455 A | 2/1988 | Neidig et al. | 361/385 |
| 4,777,561 A | 10/1988 | Murphy et al. | 361/385 |
| 4,793,405 A | 12/1988 | Diggelmann et al. | 165/104.33 |
| 4,827,733 A | 5/1989 | Dinh | 62/305 |
| 4,878,108 A | 10/1989 | Phelps, Jr. et al. | 357/81 |
| 4,880,052 A | 11/1989 | Meyer, IV et al. | 165/104.14 |
| 4,912,548 A | 3/1990 | Shanker et al. | 357/82 |
| 4,921,041 A | 5/1990 | Akachi | 165/104.29 |
| 4,931,905 A | 6/1990 | Cirrito et al. | 361/385 |
| 4,933,746 A | 6/1990 | King | 357/81 |
| 4,941,530 A | 7/1990 | Crowe | 165/104.33 |
| 4,949,164 A | 8/1990 | Ohashi et al. | 357/82 |
| 4,982,274 A | 1/1991 | Murase et al. | 357/82 |
| 5,003,376 A | 3/1991 | Iversen | 357/82 |
| 5,027,892 A | 7/1991 | Bannon et al. | 165/41 |
| 5,033,539 A | 7/1991 | Kohtaka | 165/104.14 |
| 5,040,096 A | 8/1991 | Churchill et al. | 361/386 |
| 5,063,475 A | 11/1991 | Balan | 361/384 |
| 5,077,601 A | 12/1991 | Hatada et al. | 357/81 |
| 5,083,194 A | 1/1992 | Bartilson | 357/81 |
| 5,097,387 A | 3/1992 | Griffith | 361/385 |
| 5,117,901 A | 6/1992 | Cullimore | 165/86 |
| 5,150,278 A | 9/1992 | Lynes et al. | 361/386 |
| 5,154,792 A | 10/1992 | Patterson | 156/307.3 |
| 5,166,775 A | 11/1992 | Bartilson | 361/383 |
| 5,181,167 A | 1/1993 | Davidson et al. | 361/385 |
| 5,198,889 A | 3/1993 | Hisano et al. | 257/678 |
| 5,203,399 A | 4/1993 | Koizumi | 165/104.33 |
| 5,219,020 A | 6/1993 | Akachi | 165/104.26 |
| 5,230,564 A | 7/1993 | Bartilson et al. | 374/178 |
| 5,239,200 A | 8/1993 | Messina et al. | 257/714 |
| 5,253,702 A | 10/1993 | Davidson et al. | 165/80.4 |
| 5,264,984 A * | 11/1993 | Akamatsu | 361/689 |
| 5,268,812 A | 12/1993 | Conte | 361/698 |
| 5,283,715 A | 2/1994 | Carlsten et al. | 361/702 |
| 5,291,064 A | 3/1994 | Kurokawa | 257/714 |
| 5,329,425 A | 7/1994 | Leyssens et al. | 361/701 |
| 5,329,993 A | 7/1994 | Ettehadieh | 165/104.14 |
| 5,331,510 A | 7/1994 | Ouchi et al. | 361/702 |
| 5,333,470 A | 8/1994 | Dinh | 62/333 |
| 5,345,107 A | 9/1994 | Daikoku et al. | 257/717 |
| 5,349,237 A | 9/1994 | Sayka et al. | 257/715 |
| 5,353,192 A | 10/1994 | Nordin | 361/700 |
| 5,361,188 A | 11/1994 | Kondou et al. | 361/695 |
| 5,365,400 A | 11/1994 | Ashiwake et al. | 361/752 |
| 5,365,749 A * | 11/1994 | Porter | 62/259.2 |
| 5,404,938 A | 4/1995 | Dinh | 165/113 |
| 5,409,055 A | 4/1995 | Tanaka et al. | 165/104.33 |
| 5,454,428 A | 10/1995 | Pickard et al. | 165/49 |
| 5,509,468 A * | 4/1996 | Lopez | 165/144 |
| 5,513,071 A | 4/1996 | LaViolette et al. | 361/703 |
| 5,587,880 A | 12/1996 | Phillips et al. | 361/687 |
| 5,613,552 A | 3/1997 | Osakabe et al. | 165/104.21 |
| 5,625,227 A | 4/1997 | Estes et al. | 257/712 |
| 5,708,297 A | 1/1998 | Clayton | 257/723 |
| 5,712,762 A | 1/1998 | Webb | 361/687 |
| 5,713,413 A | 2/1998 | Osakabe et al. | 165/104.33 |
| 5,720,338 A | 2/1998 | Larson et al. | 165/46 |
| 5,751,062 A | 5/1998 | Daikoku et al. | 257/722 |
| 5,780,928 A | 7/1998 | Rostoker et al. | 257/713 |
| 5,829,516 A | 11/1998 | Lavochkin | 165/80.4 |
| 5,832,989 A | 11/1998 | Osakabe et al. | 165/104.33 |
| 5,836,381 A | 11/1998 | Osakabe et al. | 165/104.21 |
| 5,844,777 A | 12/1998 | Gates | 361/700 |
| 5,880,524 A | 3/1999 | Xie | 257/704 |
| 5,953,930 A | 9/1999 | Chu et al. | 62/259.2 |
| 6,055,157 A | 4/2000 | Bartilson | 361/699 |
| 6,104,611 A * | 8/2000 | Glover et al. | 361/700 |
| 6,137,682 A * | 10/2000 | Ishimine et al. | 361/704 |
| 6,167,621 B1 | 1/2001 | Goth et al. | 29/890.054 |
| 6,173,759 B1 | 1/2001 | Galyon et al. | 165/80.4 |
| 6,205,796 B1 * | 3/2001 | Chu et al. | 62/94 |
| 6,223,810 B1 | 5/2001 | Chu et al. | 165/104.33 |

* cited by examiner

INTEGRATED THERMAL ARCHITECTURE FOR THERMAL MANAGEMENT OF HIGH POWER ELECTRONICS

FIELD OF THE INVENTION

The present invention generally relates to the management of thermal energy generated by electronic systems, and more particularly to a packaging scheme for efficiently and cost effectively routing and controlling the thermal energy generated by electronic systems.

BACKGROUND OF THE INVENTION

The electronics industry, following Moore's Law, has seemed to be able to defy the laws of economics by providing ever increasing computing power at less cost. However, the industry has not been able to suspend the laws of physics inasmuch as high computing performance has been accompanied by increased heat generation. Board level heat dissipation has advanced to a point that several years ago was only seen at the system level. The trend toward ever increasing heat dissipation in microprocessor and amplifier based systems, such as are housed in telecommunication cabinets, is becoming increasingly critical to the electronics industry. In the foreseeable future, finding effective thermal solutions will become a major constraint for the reduction of system cost and time-to-market, two governing factors between success and failure in commercial electronics sales.

The problems caused by the increasing heat dissipation are further compounded by the industry trend toward system miniaturization—one of the main methodologies of the electronics industry to satisfy the increasing market demand for faster, smaller, lighter and cheaper electronic devices. The result of this miniaturization is increasing heat fluxes. For example, metal oxide semiconductor-controlled thyristors may generate heat fluxes from 100 to 200 $W/cm^2$, some high voltage power electronics for military applications may generate heat fluxes of 300 $W/cm^2$, while some laser diode applications require removal of 500 $W/cm^2$. Also, non-uniform heat flux distribution in electronics may result in peak heat fluxes in excess of five times the average heat flux over the entire semiconductor chip surface (~30 $W/cm^2$). Under such conditions, integrating advanced heat spreading mechanisms into the back of the semiconductor chip becomes an attractive option due to the elimination of undesirable thermal interfaces.

Thus, as clock speeds for integrated circuits increase, package temperatures will be required to correspondingly decrease to achieve lower junction temperatures. However, increasing package temperatures will result from the increase in heat dissipation in the package from higher clock speed devices. This increase in temperature will cascade throughout the interior of the structure that encloses or houses such circuits, (e.g. a typical telecommunications cabinet or the like) as the number of high power semiconductor components positioned within the housing increases. The difference between these physical aspects (i.e., the difference between the interior cabinet temperature and the package temperature) of the electronic system defines a "thermal budget" that is available for the design of the cooling devices/systems needed to manage the heat fluxes generated by the various electronic devices in the system. As these two conflicting parameters converge, the available thermal budget shrinks. When the thermal budget approaches zero, refrigeration systems become necessary to provide the requisite cooling of the electronic system.

It is well known to those skilled in the art that thermal resistances (often referred to as "delta-T") for typical thermal systems at the semiconductor junction-to-package, package-to-sink and sink-to-air levels have been trending up over the past decade. The lack of understanding of microscale heat transfer physics, the requirement of matching the coefficients of thermal expansion (C.T.E.'S) of a semiconductor chip and the thermal energy spreading materials, and the potential adverse effect on conventional packaging practices of integrating heat transfer mechanisms into packages, have largely limited the choice of cooling/spreading techniques at the semiconductor chip and semiconductor package levels to heat conduction.

Extensive efforts in the areas of heat sink optimization (including the use of heat pipes) and interface materials development in the past have resulted in the significant reduction of sink-to-air and package-to-sink thermal resistances. However, the reduction of these two thermal resistances has now begun to approach the physical and thermodynamic limitations of the materials. On the other hand, the junction-to-package thermal resistance (delta-T) has increased recently, due to the increasing magnitude and non-uniformity (localization) of the heat generation and dissipation from the semiconductor package. Prior art thermal transfer approaches, such as the use of AlSiC, CuW and diamond as semiconductor package lid and interface materials, have become inadequate for handling increasing heat dissipation requirements.

Successful cooling technologies must deal with thermal issues at the device, device cluster, printed wiring board, subassembly, and cabinet or rack levels, all of which are within the original equipment manufacturer's (OEM's) products. Many times, the problem is further complicated by the fact that the thermal solution is an "after thought" for the OEM. A new equipment design may utilize the latest software or implement the fastest new semiconductor technology, but the thermal management architecture is generally relegated to the "later phases" of the new product design. The thermal management issues associated with a designed electronic system are often solved by the expedient of a secondary cooling or refrigeration system that is arranged in tandem with the electronics system.

There are several negatives associated with the use of tandem cooling or refrigeration systems. The additional electrical power required by such systems not only increases the cost to operate the electronic equipment, but also causes an adverse environmental impact in the form of pollution (from power generation processes) and noise. Reliability issues are also of considerable concern with refrigeration systems.

Therefore, a compound challenge in the art is to provide a thermal management architecture that satisfactorily accumulates and transfers variable amounts of thermal energy, generated by a wide variety of electronic components arranged together in an enclosed space, while avoiding or minimizing the use of non-passive, tandem cooling or refrigeration systems for cooling. As a consequence, there is a need in the art for a cost effective, integral thermal management architecture for high power electronic systems.

SUMMARY OF THE INVENTION

In its broadest aspects, the present invention provides a thermal energy management architecture for a functioning system of electronic components and subsystems comprising a hierarchical scheme in which thermal management components are operatively engaged with individual portions of the system of electronic components and subsystems, in multiple defined levels, and are either (i)

substantially only thermally driven, i.e., passive heat transfer devices that have no moving parts and require no external power for their operation, or (ii) comprise self-contained means for driving a thermal energy transfer mechanism.

In one embodiment of the invention, a thermal energy management architecture for a functioning system of electronic components and subsystems comprises:

- a first level of heat transfer devices comprising means for thermal energy spreading that are substantially thermally driven or include self-contained means for driving a thermal energy spreading mechanism, and are operatively engaged with at least one semiconductor chip;
- a second level of heat transfer devices comprising means for thermal energy spreading that are substantially thermally driven or include self-contained means for driving a thermal energy spreading mechanism, and are operatively engaged with at least one semiconductor chip package;
- a third level of heat transfer devices comprising means for busing thermal energy that are substantially thermally driven or include self-contained means for driving a thermal energy busing mechanism, and are operatively engaged with at least one of either the first level and second level means for thermal energy spreading; and
- a fourth level of heat transfer devices comprising means for busing thermal energy that are either substantially thermally driven or include self-contained means for driving a thermal energy busing mechanism, and are operatively engaged with at least one of the first level means, second level means, and third level means.

In certain applications, a fifth level of heat transfer device is provided comprising one or more means for busing thermal energy that are thermally driven or include self-contained means for driving a thermal energy busing mechanism, and are operatively engaged with one or more individual high power components wherein the fifth level means are arranged so as to by-pass the level two, level three and level four heat transfer means.

BRIEF DESCRIPTION OF THE DRAWINGS

These and other features and advantages of the present invention will be more fully disclosed in, or rendered obvious by, the following detailed description of the preferred embodiment of the invention, which is to be considered together with the accompanying drawings wherein like numbers refer to like parts and further wherein.

DETAILED DESCRIPTION OF THE PREFERRED EMBODIMENT

Figure 1:
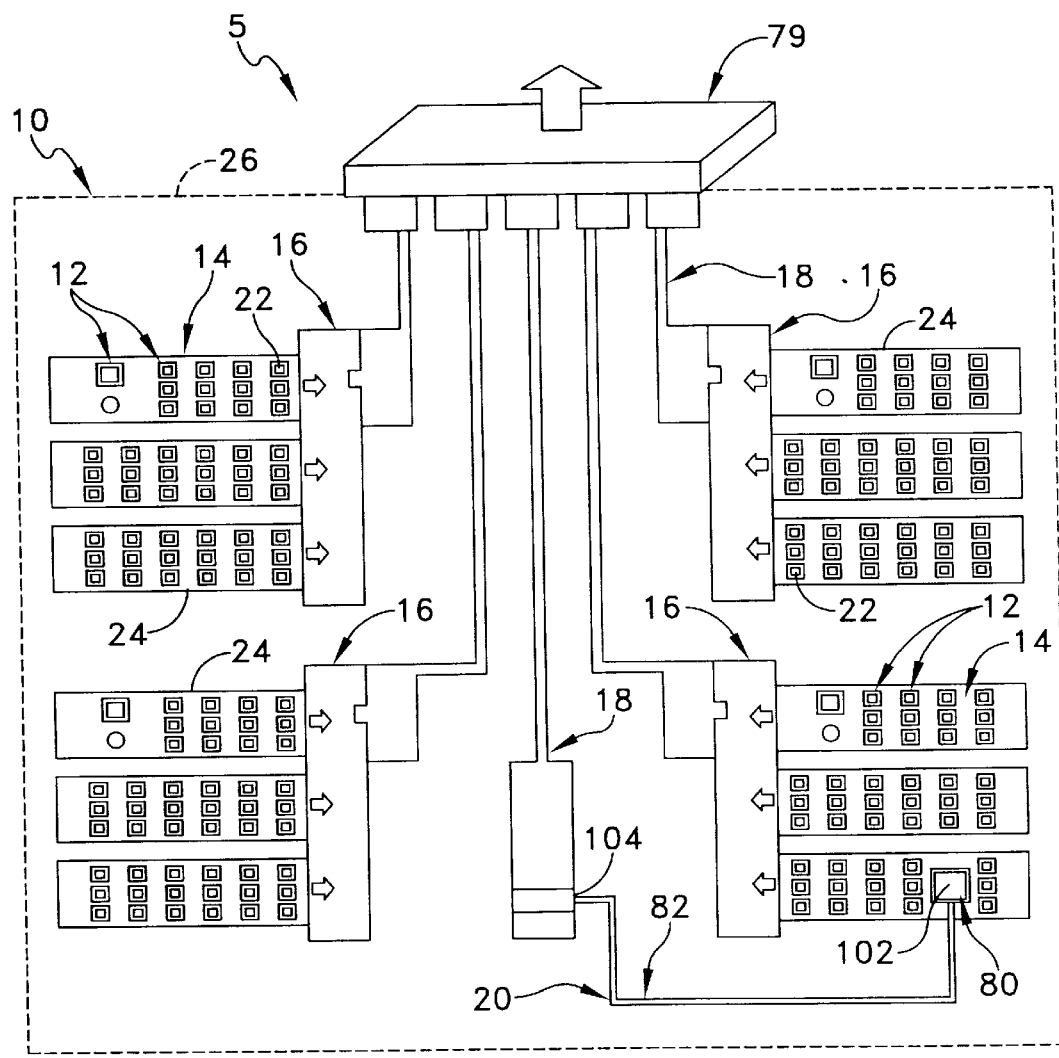
FIG. 1 is a schematic representation of a thermal management architecture formed in accordance with the present invention.

This description of preferred embodiments is intended to be read in connection with the accompanying drawings, which are to be considered part of the entire written description of this invention. In the description, relative terms such as "horizontal", "vertical", "up", "down", "top" and "bottom" as well as derivatives thereof (e.g.,"horizontally", "downwardly", "upwardly", etc.) should be construed to refer to the orientation as then described or as shown in the drawing figure under discussion. These relative terms are for convenience of description and normally are not intended to require a particular orientation. Terms including "inwardly" versus "outwardly", "longitudinal" versus "lateral" and the like are to be interpreted relative to one another or relative to an axis of elongation, or an axis or center of rotation, as appropriate. Terms concerning attachments, coupling and the like, such as "connected" and "interconnected", refer to a relationship wherein structures are secured or attached to one another either directly or indirectly through intervening structures, as well as both movable or rigid attachments or relationships, unless expressly described otherwise. The term "operatively connected or interconnected" is such an attachment, coupling or connection that allows the pertinent structures to operate or communicate as intended by virtue of that relationship. In the claims, means-plus-function clauses are intended to cover the described structures for performing the recited function, including not only structural equivalents but also equivalent structures.

Referring to FIG. 1, the present invention provides a thermal energy management architecture 5 that may be implemented in a functioning system of electronic components and/or subsystems (herein referred to simply as electronics system 10). Thermal energy management architecture 5 generally comprises a hierarchical scheme of thermal management components that are operatively engaged with individual components or groups of components that form electronics system 10, in multiple defined levels. For convenience of discussion, the hierarchical scheme of thermal management components has been identified as a series of "levels", arbitrarily numbered one through seven, and roughly corresponding to the hierarchical scheme and general organization of the electrical systems to be cooled. Of course, as such systems of electronic components and subsystems increase in complexity, and the use of new electronic or optical technologies are incorporated, the number and constituency of such levels will change, all without deviating from the thermal energy management architecture of the present invention.

Advantageously, the thermal management components are either (i) substantially only thermally driven, i.e., passive heat transfer devices that have no moving parts and require no external power for their operation, or (ii) comprise self-contained means for driving a thermal energy transfer mechanism. In other words, the thermal management components comprise heat transfer devices that either have no moving structural parts and require no external power for their operation, or include some electro-mechanical structures, e.g., miniature piezoelectric based or microminiature pumps, fans, or the like, that provide means for moving a thermal energy transfer medium, e.g., fluids or gases, from one location to another within the thermal management component or device. As a consequence, the thermal budget for electronics system 10 may be maintained or even increased without the need for additional power to operate secondary, tandem cooling or refrigeration systems and the like or the additional space required to house such powered cooling systems.

In one embodiment of the invention, thermal energy management architecture 5 comprises a first level of heat transfer devices 12, a second level of heat transfer devices 14, a third level of heat transfer devices 16, a fourth level of heat transfer devices 18, and in some instances, a fifth level of heat transfer devices 20.

Figure 2:
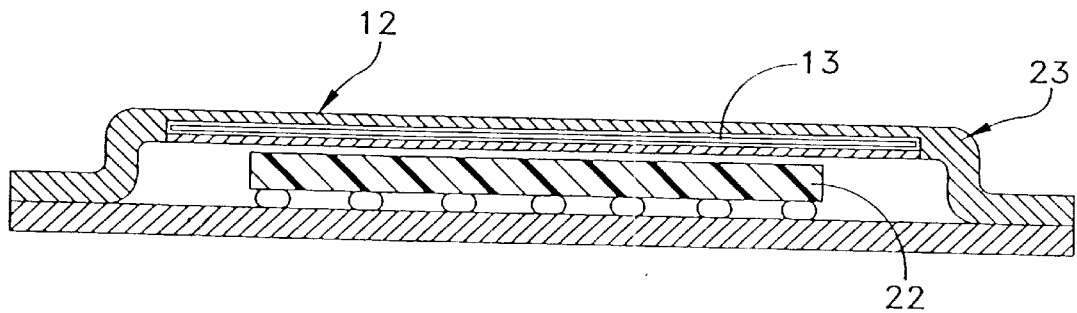
FIG. 2 is a cross-sectional representation of a first level heat transfer device.

More particularly, first level of heat transfer devices 12 comprises means for thermal energy spreading that are operatively engaged with at least one semiconductor device 22 within electronics system 10 so as to be thermally driven by the heat generated by the device during its operation. Typically, electronics system 10 will contain a multitude of such semiconductor devices 22 spread throughout the system on printed wiring boards, circuit cards, or within stand-alone modules (herein referred to as circuit card/board 24). One or more semiconductor devices 22 are very often mounted within a semiconductor package 23 (FIG. 2) and supported upon a rack/chassis 26 (FIGS. 1 and 6) that forms a portion of the interior of a cabinet housing electronics system 10.

Many next generation, highly integrated semiconductor devices are plagued by the occurrence of "hot spots", i.e., localized areas on the chip having relatively high thermal energy generation. These hot spots arise at locations on the chip where significant electrical activity occurs, e.g., processor, I/O control circuits, etc. The manner of cooling these devices has depended upon many parameters, including the space available for the cooling process, the temperatures to be encountered, the location(s) of hot spots, and the ability to distribute or "spread" the thermal energy over sufficient surface area to provide for efficient heat transfer. Thus, first level heat transfer devices 12 are provided for the purpose of spreading thermal energy generated by individual semiconductor devices 22, and will often form a portion of semiconductor package 23.

A preferred first level of heat transfer device 12 would also efficiently and evenly spread thermal energy generated by hot spots on semiconductor device 22 across a substantial portion of semiconductor package 23 so that the thermal energy may be removed rapidly and effectively from the package. This preferred first level of heat transfer device 12 would provide adequate first level means for thermal energy spreading, since it would be thermally driven by the heat generated during the operation of semiconductor device 22, and not require moving structural parts or external power to operate. Of course, microminiature piezopumps or the like may be used to transport a fluid across the surface of the semiconductor chip in order to better spread the thermal energy.

By way of illustrative example only, one technology that would function adequately in a first level heat transfer device 12 is a miniature heat pipe heat spreader 13. For example, micro-grooves may be arranged in a surface of the one or more semiconductor devices 22 to facilitate a thermally driven pulsating or reciprocating two-phase flow of a fluid coolant. Sintered powder wicks may also be provided to enhance the boiling of a conventional working coolant fluid. Miniature pulsating heat pipe technology can handle concentrated heat fluxes exceeding 250 W/cm$^2$ at thermal resistances below 0.15° C./W/cm$^2$.

Of course, many of the prior art semiconductor device level thermal transfer and heat spreading technologies would provide adequate results in connection with the present invention, as disclosed by way of example only, in U.S. Pat. Nos.: 4,047,198, 4,138,692, 4,145,708, 4,697,205, 4,727,455, 4,878,108, 4,880,052, 4,912,548, 4,931,905, 4,982,274, 5,097,387, 5,198,889, 5,239,200, 5,253,702, 5,268,812, 5,283,715, 5,291,064, 5,329,993, 5,345,107, 5,349,237, 5,365,400, 5,625,227, 5,708,297, 5,751,062, 5,780,928, and 5,880,524. The foregoing U.S. patents are hereby incorporated herein by reference. These and other prior art devices use heat pipe or the like structures to transfer thermal energy away from semiconductor device 22 and to semiconductor package 23.

Figure 3:
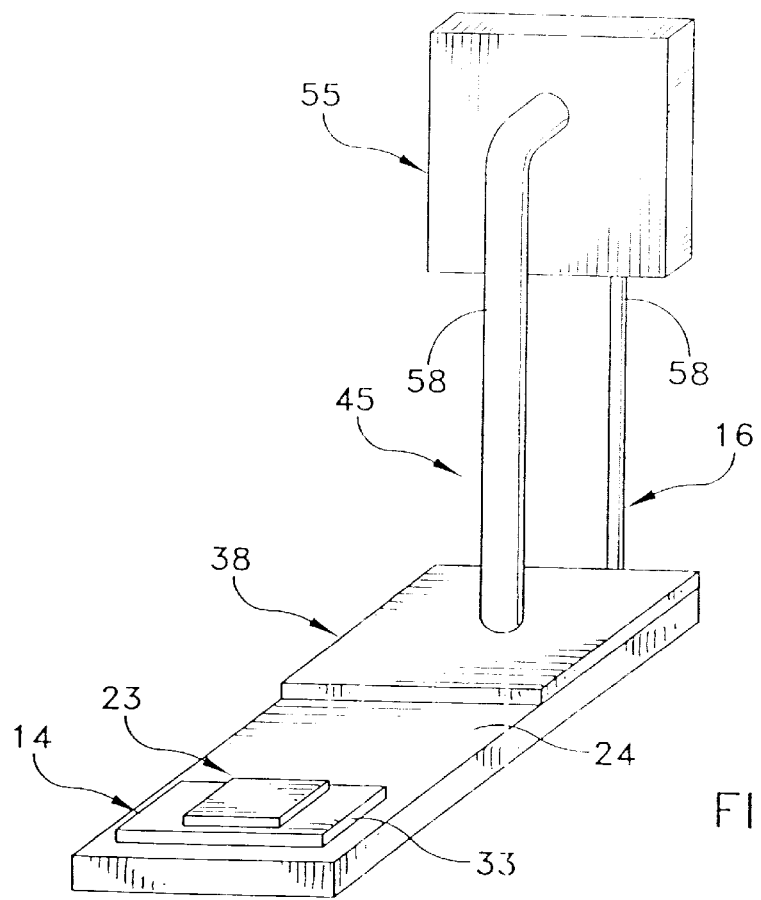
FIG. 3 is a diagrammatic representation of a circuit card incorporating a second level heat transfer device and a third level heat transfer device arranged and communicating in accordance with the present invention.

Referring to FIGS. 1 and 3, second level of heat transfer devices 14 comprises means for thermal energy spreading that form a portion of, or are operatively engaged with at least one semiconductor package 23. Second level of heat transfer devices 14 provide further heat spreading between component containers (i.e., integrated circuit chip packages 23) and circuit card/board 24. Second level of heat transfer devices 14 are normally required for high power components, such as radio-frequency amplifiers and the like, used in connection with, e.g., telecommunication equipment. Second level of heat transfer devices 14 provide the ability to distribute or further "spread" the thermal energy generated by individual and/or groups of semiconductor devices 22 and semiconductor packages 23 over a sufficiently increased surface area to provide for efficient busing of the heat away from those components.

Figure 4:
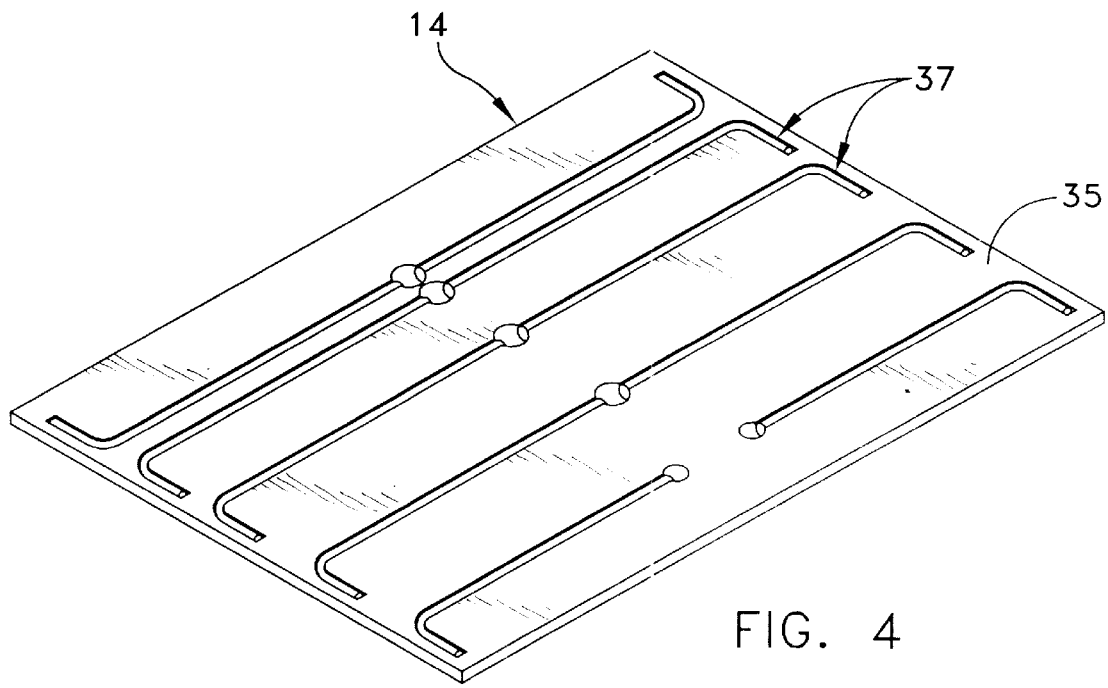
FIG. 4 is a perspective view of an aluminum plate with imbedded heat pipes.
Figure 5:
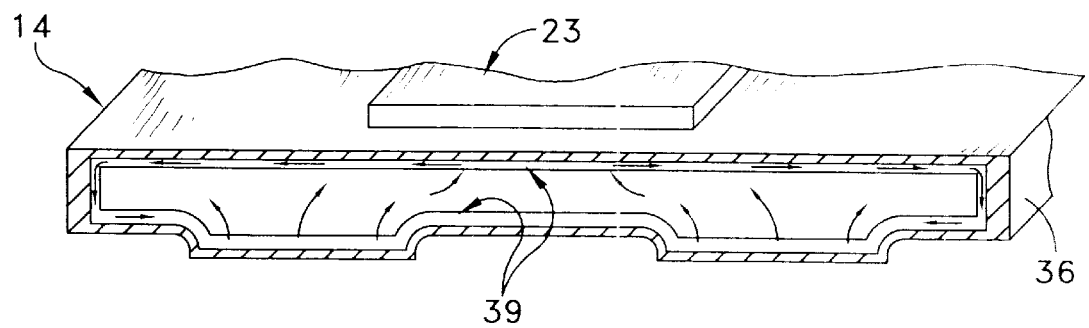
FIG. 5 is a cross-sectional perspective representation of a level two vapor chamber heat spreader.

Circuit cards/boards 24 mounted to solid copper or aluminum heat spreaders 33 (FIG. 3) have been used with adequate results, as have aluminum plates 35 with embedded heat pipes 37 (FIG. 4). Vapor chamber heat spreaders 36 provide even higher performance (FIG. 5). For example, vapor chamber heat spreaders 36, with sintered wicks 39, have been used to handle heat fluxes up to 100 W/cm$^2$. Many of the foregoing second level of heat transfer devices 14 are supported upon rack/chassis 26 within the cabinet housing electronics system 10. For moderate packing density of modest power components, the thermal planes within circuit cards/boards 24 provide adequate conduction of heat to rack/chassis 26. Heat pipe thermal planes 34 (also called heat pipe cold plates) can greatly increase thermal capacity (FIG. 6).

Of course, many of the prior art semiconductor package level thermal transfer and heat spreading technologies are known in the art, by way of example only, U.S. Pat. Nos.: 2,720,763, 3,613,778, 3,651,865, 3,749,156, 3,754,594, 4,046,190, 4,118,756, 4,231,423, 4,323,914, 4,366,526, 4,503,483, 4,602,679, 4,777,561, 4,931,905, 5,083,194, 5,166,775, 5,181,167, 5,230,564, 5,283,715, 5,331,510, 5,353,192, 5,409,055, 5,708,297, 5,712,762, 5,720,338, 5,844,777, and 6,055,157, would also provide adequate second level means for thermal energy spreading since they may be operatively engaged with at least one semiconductor package so as to be thermally driven by the heat generated during the operation of the device. The foregoing U.S. patents are hereby incorporated herein by reference.

Figure 6:
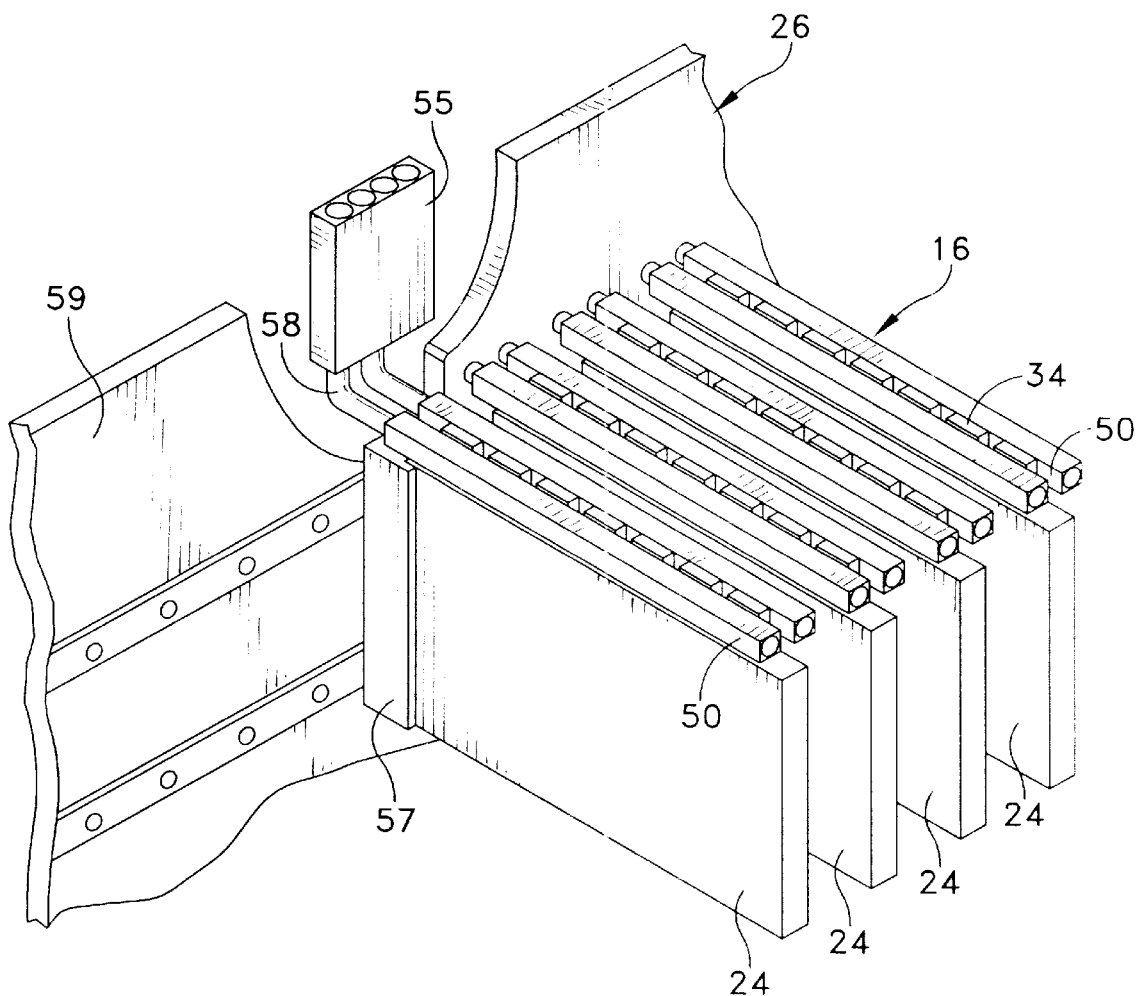
FIG. 6 is a perspective diagram representing third level and fourth level heat transfer devices formed and arranged in accordance with the present invention.

Referring to FIGS. 1, 3, and 6, third level heat transfer devices 16 comprise means for busing thermal energy that are thermally driven and operatively interconnected with at least one of either first level heat transfer devices 12 or second level heat transfer devices 14. As used herein, the terms "busing, buses, or bus" mean to transport or otherwise transfer thermal energy in a directed manner from one location to another location. Third level heat transfer devices 16 may comprise a variety of configurations, and very often form a portion of rack/chassis 26 that structurally supports a plurality of circuit cards/boards 24. The individual components associated with third level heat transfer devices 16 may include a variety of thermal transfer technologies.

For example, circuit card/board 24 can itself be either a vapor chamber heat spreader 36 or an aluminum plate embedded with heat pipes 35 as disclosed in connection with second level heat transfer devices 14. Embedded heat pipe cold plates 35 and/or vapor chamber cold plates 36 may transport thermal energy to an evaporator 38 of a loop thermosyphon 45 (FIG. 3). Here, evaporator 38 engages one or more circuit cards/boards 24 and is arranged in thermal communication with either first level heat transfer devices 12 or second level heat transfer devices 14, or both.

In another embodiment, heat pipe rails 50 bus heat from thermal planes 34, that are associated with individual circuit cards/boards 24 to condenser plates 55 located at a rear portion of a rack/chassis 26 (FIG. 6). These heat pipe rails 50 may be clamped to a thermally conductive portion of circuit cards/boards 24 by means of a thermo-mechanical locking mechanism or the like (not shown). Advantageously, this clamping is separate from any electrical interconnections 57 that may be employed in rack/chassis 26 so as to not alter the normal insertion and removal of circuit cards/boards 24 in electronics system 10. Many cabinets incorporate an internal rear wall 59 so that the rear section of the cabinet serves as a cable tray and/or a chimney for convective cooling. Heat pipe rails 50 can penetrate this internal rear wall 59, via busing conduits 58, so as to maintain isolation of this space from a front portion of the cabinet.

Of course, many of the prior art thermal transfer technologies that are known in the art, by way of example only, U.S. Pat. Nos.: 2,742,268, 3,317,798, 3,563,307, 3,903,699, 4,222,436, 4,259,268, 4,333,517, 4,452,051, 4,607,498, 4,724,901, 4,793,405, 4,827,733, 4,921,041, 4,941,530, 4,949,164, 5,003,376, 5,027,892, 5,033,539, 5,063,475, 5,077,601, 5,117,901, 5,150,278, 5,203,399, 5,219,020, 5,333,470, 5,361,188, 5,404,938, 5,513,071, 5,713,413, 5,720,338, 5,832,989, 5,836,381, 5,953,930, and 6,223,810, would also provide adequate third level means for thermal energy transport if they may be operatively engaged with at least one of either first level heat transfer devices 12 or second level heat transfer devices 14 so as to be thermally driven by the heat generated during the operation of the active electronic devices mounted in those structures. The foregoing U.S. patents are hereby incorporated herein by reference.

Referring to FIGS. 1, 3, 6, 7, and 8, fourth level of heat transfer devices 18 comprise means for busing thermal energy that are thermally driven and operatively engaged with at least one of first level of heat transfer devices 12, second level of heat transfer devices 14, or third level of heat transfer devices 16. The thermal resistance ($R_{s-a}$ for air cooling systems) is inversely proportional to the product of the heat transfer coefficient (h) of the thermal bus (air, liquid or two-phase flow) and the heat transfer surface area (A) at the fourth level thermal energy transport (the structures of which fourth level are referred to collectively as a "thermal bus"). The increase of the heat transfer surface area (A) is usually limited by the space available in the cabinet.

Figure 7:
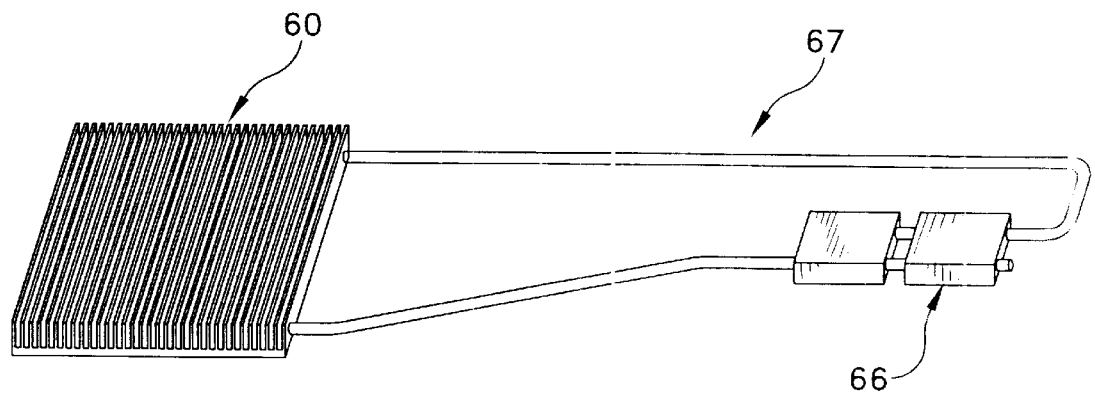
FIG. 7 is a perspective view of a loop thermosyphon of a type contemplated for use at levels three, four, and five of the present thermal management architecture invention.

A general example of a loop thermosiphon 67 is shown in FIG. 7, which may perform a level four thermal bus function by transporting the thermal energy from first level of heat transfer devices 12, second level of heat transfer devices 14, or third level of heat transfer devices 16. Typically, loop thermosiphon 67 buses thermal energy by operatively interconnecting an evaporator 66 to a condenser portion of levels one, two, and/or three devices, and thereby transporting that thermal energy to a condenser stack 60 located at a "remote" location in or outside on the cabinet housing electronic systems 10. Condenser stack 60 may be coupled with, e.g., liquid cooled cold plates or a fin stack for further dissipation of the thermal energy. More particularly, a two-stage loop thermosiphon bus is provided in which loop thermosiphon 45 or 67 provides the first stage by being thermally coupled with at least one second level of heat transfer device 14. For example, condenser plate 55 may form a coupling structure which allows first stage loop thermosiphon 45 or 67 to couple and de-couple (for assembly convenience) with a second stage loop thermosyphons 75, via evaporators 76. Condensers 77 of second stage loop thermosyphons 75 may be cooled by either air or liquid, and are operatively interconnected with evaporators 76 by conduits 78.

Figure 9:
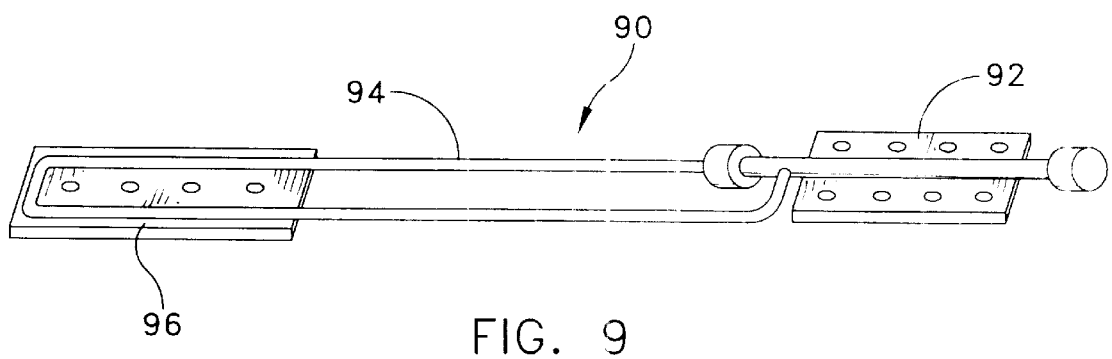
FIG. 9 is a perspective view of a loop heat pipe.

Another embodiment providing a thermal bus technology is loop heat pipe 90 (FIG. 9). Unlike the loop thermosyphon that must rely on the gravity to return the working fluid, loop heat pipe 90 relies upon capillary wicks within an evaporation plate 92 and conduit 94 to circulate a working fluid to and from a condenser plate 96, and is thus capable of passively operating at any orientation.

Of course, many of the prior art thermal transfer technologies known in the art, and identified hereinabove, would also provide adequate fourth level means for thermal energy transport if they may be operatively engaged with at least one of either first level heat transfer devices 12, second level heat transfer devices 14, and/or third level heat transfer devices 16 so as to be thermally driven by the heat generated during the operation of the active electronic devices mounted in those structures. The foregoing U.S. patents are hereby incorporated herein by reference.

In one preferred alternative embodiment, a fifth level of heat transfer devices 20 are provided comprising one or more means for busing thermal energy that are thermally driven and operatively engaged with one or more individual high power components 80 (FIG. 1). Certain high power components 80 generate orders of magnitude more heat than other semiconductor devices 22 on the same circuit card. Instead of treating the high power components the same way, i.e., going through second and third level of heat transfer devices 14, 16 to reach fourth level of heat transfer devices 18, the more effective way is to directly link these components to a thermal bus, via a "thermal patchcord" 82 thus eliminating interface thermal resistances. Fifth level of heat transfer devices 20 are often arranged within thermal energy management architecture 5 so as to by-pass second, third, and fourth levels of heat transfer devices 14,16, and 18, respectively.

Figure 10:
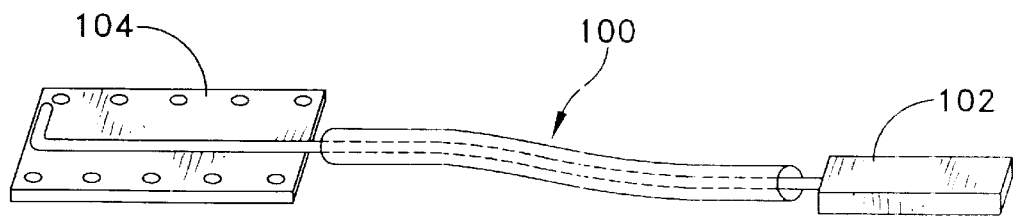
FIG. 10 is a perspective view of a flexible heat pipe of the type contemplated for use at level five of the thermal management architecture of the present invention.
Figure 8:
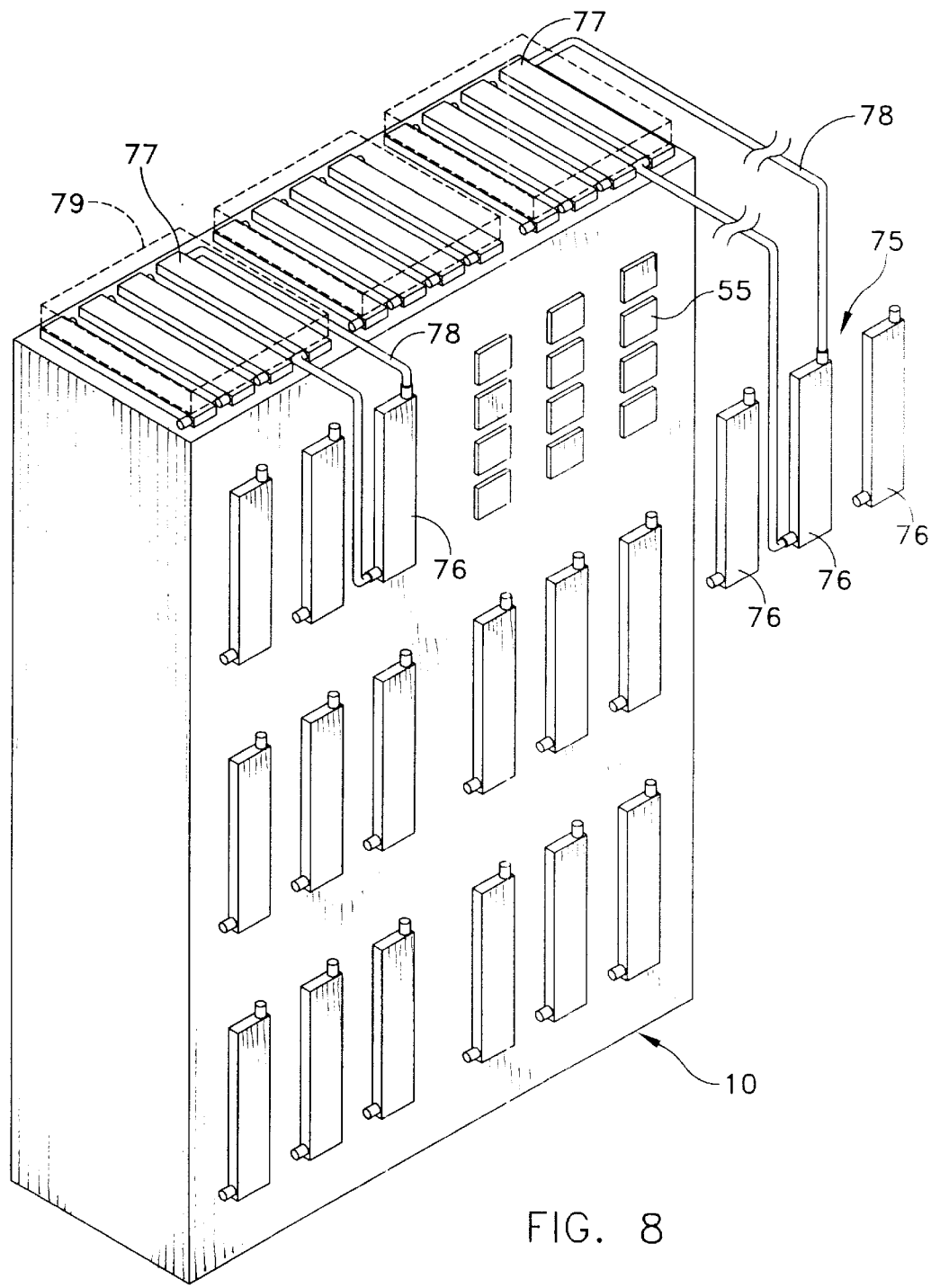
FIG. 8 is a perspective view, partially in phantom, of an electronic system cabinet including level four thermal transfer devices arranged in accordance with the thermal architecture of the present invention.

In their most general aspects, thermal patchcords 82 are flexible two-phase heat transport devices. If the configuration permits the use of loop thermosyphons, they are the simplest choice. Flexible heat pipes 100 may be used in certain circumstances (FIG. 10). If heat must be moved against an adverse elevation, a loop heat pipe 90 may be used. An evaporator plate 102 is fastened and thermally interconnected, e.g., bolted or clamped, to a high powered component 80, and a condenser plate 104 is attached to a thermally interconnecting portion of a fourth level of heat transfer device 18, e.g., evaporator 66 of a loop thermosyphon 67. Of course, it will be understood that condenser plate 104 may be interconnected to an evaporation portion of another loop heat pipe 90 or loop thermosyphon 67 that form a part of a fourth level heat transfer device 18.

An effective technology for fifth level heat transfer device 20 provides high heat flux capability, since one end of this thermal link is attached to high power (heat flux) components. The heat flux can be as high as several hundred watts per square centimeter. Additionally, effective fifth level heat transfer devices 20 comprise structural flexibility, since they provide a thermal link that must be sufficiently flexible to link the high power components and the thermal bus without interfering with other components in electronic system 10 (e.g., flexible heat pipe 100). Also, effective fifth level heat transfer devices 20 provide for passive operation, thus no pumps or fans are involved thereby providing compactness. Low coefficient of thermal expansion materials are also often utilized, since to cool some ultra-high heat flux components, it is beneficial for one end of a fifth level thermal link to be hard bonded to the component, eliminating the thermal interface between them.

A sixth level of non-passive heat transfer devices comprising means for thermal energy transfer may be operatively engaged with at least one of first level of heat transfer devices 12, second level of heat transfer devices 14, third level of heat transfer devices 16, or fourth level of heat transfer devices 18. Fifth level of non-passive heat transfer devices 79 typically comprise heat exchangers driven by fans, blowers or pumps that are all well known in the art. The only exceptions are natural convection based systems for very low power electronic systems (not shown). For higher power electronic systems 10, various air/air and liquid/air heat exchangers and refrigeration systems may be employed to dissipate thermal energy gathered by at least one of first level of heat transfer devices 12, second level of heat transfer devices 14, third level of heat transfer devices 16, or fourth level of heat transfer devices 18, to the ambient environment, e.g., the atmospheric air surrounding electronics system 10. Such heat exchangers can be inside or outside of the structures housing electronics system 10. For example, telecommunication cabinets will have such sixth level of non-passive heat transfer devices 79 as an integral part of the cabinet infrastructure, while in some server center applications, sixth level of non-passive heat transfer devices 79 are located outside the server box.

A seventh level of thermal management may also be considered within the scope of the present invention, comprising the apparatus and structures that maintain the room-surrounding the cabinet housing electronics system 10. These systems generally comprise HVAC systems or the like in combination with fans and other air circulation devices that bus the heat from the room to the outdoor environment. These structures are usually specified for the particular equipment to be housed in the room.

ADVANTAGES OF THE INVENTION

Numerous advantages are obtained by employing the present invention.

More specifically, a thermal energy management architecture comprising a hierarchical scheme of thermal management components that are operatively engaged with individual components or groups of components that form an electronic system is provided which avoids all of the aforementioned problems associated with prior art systems for managing thermal energy generated by electronic systems.

In addition, a thermal energy management architecture is provided that incorporates advanced cooling/heat spreading technologies at the semiconductor device and semiconductor device package that enables the package temperature to increase without overheating at the junction level, thus reversing the trend of decreasing case/lid temperature.

Furthermore, a thermal energy management architecture is provided that incorporates more capable and compact thermal bus technologies that reduce the temperature rise inside an enclosure housing electronic systems, thus reversing the trend of increasing enclosure temperature.

Also, a thermal energy management architecture is provided that avoids, reduces, or delays the use of refrigeration systems that are energy intensive and environmentally unsafe, while at the same time is capable of interfacing efficiently with refrigeration systems to further extend the available thermal budget.

Additionally, a thermal energy management architecture is provided that roughly corresponds to the hierarchical scheme and general organization and connectivity of the electrical systems to be cooled, so as to develope and integrate the thermal management technologies into the electrical system structures.

It is to be understood that the present invention is by no means limited only to the particular constructions herein disclosed and shown in the drawings, but also comprises any modifications or equivalents within the scope of the claims.

What is claimed is:

1. A thermal energy management architecture for a functioning system of electronic components and subsystems comprising:

a first level of heat transfer devices comprising means for thermal energy spreading that are thermally driven and operatively engaged with at least one semiconductor chip;

a second level of heat transfer devices comprising means for thermal energy spreading that are thermally driven and operatively engaged with at least one semiconductor chip package;

a third level of heat transfer devices comprising means for thermal energy transport that are thermally driven and operatively engaged with at least one of said first level or second level means thermal energy spreading; and a fourth level of heat transfer devices comprising means for thermal energy transport that are thermally driven and operatively engaged with at least one of said first level means, second means, or third level means.

2. The thermal energy management architecture according to claim 1 further comprising a fifth level of heat transfer device comprising one or more means for thermal energy transport that are thermally driven and operatively engaged with one or more individual high power components within said functioning system of electronic components and subsystems and arranged so as to by-pass said level three means.

3. The thermal energy management architecture according to claim 1 further comprising sixth level of non-passive heat transfer devices comprising means for thermal energy transport that are operatively engaged with at least one of said first level means, said second means, said third level means or said fourth level means.

4. The thermal energy management architecture according to claim 1 wherein said first level means for thermal energy spreading spreads thermal energy generated by at least one hot spot located on a semiconductor device positioned adjacent to said first level means across a substantial portion of a semiconductor package housing said semiconductor device so that the thermal energy may be removed.

5. The thermal energy management architecture according to claim 1 wherein said first level means for thermal energy spreading comprises a miniature heat pipe heat spreader.

6. The thermal energy management architecture according to claim 1 wherein said first level means for thermal energy spreading comprises a miniature heat pipe heat spreader having a sintered powder wicks to enhance boiling of a conventional working coolant fluid.

7. The thermal energy management architecture according to claim 1 wherein said first level means for thermal energy spreading comprises a miniature pulsating heat pipe located in thermal flow communication with a semiconductor device.

8. The thermal energy management architecture according to claim 1 wherein said second level means for thermal energy spreading comprise at least one of solid copper and aluminum heat spreaders.

9. The thermal energy management architecture according to claim 8 wherein said at least one of solid copper and aluminum heat spreaders include embedded heat pipes.

10. The thermal energy management architecture according to claim 1 wherein said second level means for thermal energy spreading comprise a vapor chamber heat spreader having a sintered wick positioned within a sealed chamber.

11. The thermal energy management architecture according to claim 1 wherein said third level means for thermal energy transport comprise a loop thermosiphon.

12. The thermal energy management architecture according to claim 1 wherein said third level means for thermal energy transport comprise a loop heat pipe.

13. The thermal energy management architecture according to claim 1 wherein said third level means for thermal energy transport comprise a combination of a loop heat pipe and a loop thermosiphon.

14. The thermal energy management architecture according to claim 1 wherein said third level means for thermal energy transport comprise a plurality of loop heat pipes and a loop thermosiphons.

15. The thermal energy management architecture according to claim 1 wherein said third level means for thermal energy transport comprise a loop thermosiphon forming a portion of a rack/chassis that supports said functioning system of electronic components and subsystems.

16. The thermal energy management architecture according to claim 1 wherein said third level means for thermal energy transport comprise a loop heat pipe forming a portion of a rack/chassis that supports said functioning system of electronic components and subsystems.

17. The thermal energy management architecture according to claim 1 wherein said third level means for thermal energy transport comprise a combination of a loop heat pipe and a loop thermosiphon that form a portion of a rack/chassis that supports said functioning system of electronic components and subsystems.

18. The thermal energy management architecture according to claim 1 wherein said third level means for thermal energy transport comprise a plurality of loop heat pipes and a loop thermosiphons that form a portion of a rack/chassis that supports said functioning system of electronic components and subsystems.

19. The thermal energy management architecture according to claim 1 wherein said fourth level means for thermal energy transport comprise a loop thermosiphon.

20. The thermal energy management architecture according to claim 1 wherein said fourth level means for thermal energy transport comprise a loop heat pipe.

21. The thermal energy management architecture according to claim 1 wherein said fourth level means for thermal energy transport comprise a combination of a loop heat pipe and a loop thermosiphon.

22. The thermal energy management architecture according to claim 1 wherein said fourth level means for thermal energy transport comprise a plurality of loop heat pipes and a loop thermosiphons.

23. A thermal energy management architecture for a functioning system of electronic components and subsystems comprising:

a first level of heat transfer devices comprising means for thermal energy spreading that include self-contained means for driving a thermal energy spreading mechanism and are operatively engaged with at least one semiconductor chip;

a second level of heat transfer devices comprising means for thermal energy spreading that include self-contained means for driving a thermal energy spreading mechanism and are operatively engaged with at least one semiconductor chip package;

a third level of heat transfer devices comprising means for busing thermal energy that include self-contained means for driving a thermal energy busing mechanism, and are operatively engaged with at least one of said first level and said second level means for thermal energy spreading; and a fourth level of heat transfer devices comprising means for busing thermal energy that include self-contained means for driving a thermal energy busing mechanism, and are operatively engaged with at least one of said first level means, said second level means, and said third level means.

24. The thermal energy management architecture according to claim 23 further comprising a fifth level of heat transfer device comprising one or more means for thermal energy transport that are thermally driven and operatively engaged with one or more individual high power components within said functioning system of electronic components and subsystems and arranged so as to by-pass said level three means.

25. A thermal energy management architecture for a functioning system of electronic components and subsystems comprising:

a first level of heat transfer devices comprising means for thermal energy spreading that are substantially thermally driven and operatively engaged with at least one semiconductor chip;

a second level of heat transfer devices comprising means for thermal energy spreading that are substantially thermally driven and operatively engaged with at least one semiconductor chip package;

a third level of heat transfer devices comprising means for busing thermal energy that are substantially thermally and operatively engaged with at least one of said first level and said second level means for thermal energy spreading; and a fourth level of heat transfer devices comprising means for busing thermal energy that are substantially thermally driven and operatively engaged with at least one of said first level means, said second level means, and said third level means.

26. The thermal energy management architecture according to claim 25 further comprising a fifth level of heat transfer device comprising one or more means for thermal energy transport that are thermally driven and operatively engaged with one or more individual high power components within said functioning system of electronic components and subsystems and arranged so as to by-pass said level three means.

27. A thermal energy management architecture for a functioning system of electronic components and subsystems comprising:

a first level of heat transfer devices comprising means for thermal energy spreading that are substantially thermally driven or include self-contained means for driving a thermal energy spreading mechanism, and are operatively engaged with at least one semiconductor chip;

a second level of heat transfer devices comprising means for thermal energy spreading that are substantially thermally driven or include self-contained means for driving a thermal energy spreading mechanism, and are operatively engaged with at least one semiconductor chip package;

a third level of heat transfer devices comprising means for busing thermal energy that are substantially thermally driven or include self-contained means for driving a thermal energy busing mechanism, and are operatively engaged with at least one of said first level and said second level means for thermal energy spreading; and a fourth level of heat transfer devices comprising means for busing thermal energy that are either substantially thermally driven or include self-contained means for driving a thermal energy busing mechanism, and are operatively engaged with at least one of said first level means, said second level means, and said third level means.

28. The thermal energy management architecture according to claim 27 further comprising a fifth level of heat transfer device comprising one or more means for thermal energy transport that are thermally driven and operatively engaged with one or more individual high power components within said functioning system of electronic components and subsystems and arranged so as to by-pass said level three means.

* * * * *